United States Patent
Jung et al.

(10) Patent No.: US 7,525,838 B2
(45) Date of Patent: Apr. 28, 2009

(54) FLASH MEMORY DEVICE AND METHOD FOR PROGRAMMING MULTI-LEVEL CELLS IN THE SAME

(75) Inventors: Kee-Ho Jung, Suwon-si (KR); Jae-Yong Jeong, Yongin-si (KR); Chi-Weon Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 98 days.

(21) Appl. No.: 11/642,925

(22) Filed: Dec. 21, 2006

(65) Prior Publication Data

US 2008/0056006 A1    Mar. 6, 2008

(30) Foreign Application Priority Data

Aug. 30, 2006    (KR) .................. 10-2006-0082982

(51) Int. Cl.
   *G11C 11/34* (2006.01)
(52) U.S. Cl. .................. 365/185.03; 365/185.24; 365/185.18; 365/185.22; 365/185.28; 365/185.33
(58) Field of Classification Search .......... 365/185.03, 365/185.24, 185.18, 185.22, 185.28, 185.33
   See application file for complete search history.

(56) References Cited

U.S. PATENT DOCUMENTS

| | | | | |
|---|---|---|---|---|
| 5,812,457 | A * | 9/1998 | Arase ................... | 365/185.22 |
| 5,818,761 | A * | 10/1998 | Onakado et al. ....... | 365/185.18 |
| 5,991,517 | A * | 11/1999 | Harari et al. ........... | 714/3 |
| 6,101,125 | A | 8/2000 | Gorman | |
| 6,366,496 | B1 * | 4/2002 | Torelli et al. ........... | 365/185.19 |
| 6,542,403 | B1 * | 4/2003 | Parker ................... | 365/185.03 |
| 6,542,407 | B1 * | 4/2003 | Chen et al. ............. | 365/185.17 |
| 6,937,524 | B2 | 8/2005 | Shiga et al. | |
| 6,944,063 | B2 * | 9/2005 | Chen et al. ............. | 365/185.33 |
| 6,954,380 | B2 * | 10/2005 | Ono et al. .............. | 365/185.24 |
| 7,057,936 | B2 | 6/2006 | Yaegashi et al. | |
| 7,073,103 | B2 * | 7/2006 | Gongwer et al. ......... | 714/718 |
| 7,102,924 | B2 * | 9/2006 | Chen et al. ............. | 365/185.09 |
| 7,224,614 | B1 * | 5/2007 | Chan .................... | 365/185.22 |
| 7,233,529 | B2 * | 6/2007 | Matsubara et al. ....... | 365/185.3 |
| 7,283,397 | B2 * | 10/2007 | Harari et al. ........... | 365/185.22 |

FOREIGN PATENT DOCUMENTS

| | | |
|---|---|---|
| JP | 07-226097 | 8/1995 |
| JP | 2001-057091 | 2/2001 |
| JP | 2004-253089 | 9/2004 |
| KR | 1020010082518 A | 8/2001 |

OTHER PUBLICATIONS

U.S. Appl. No. 11/847,388, filed Aug. 30, 2007.

* cited by examiner

*Primary Examiner*—Viet Q Nguyen
(74) *Attorney, Agent, or Firm*—Volentine & Whitt, P.L.L.C.

(57) ABSTRACT

A method for programming a flash memory device is provided, where the flash memory device includes a plurality of memory cells, and where a threshold voltage of each of the memory cells is programmable in any one of plural corresponding data states. The method includes programming selected memory cells in a first data state, verifying a result of the programming, successively programming selected memory cells in at least two or more data states corresponding to threshold voltages which are lower than a corresponding threshold voltage of the first data state, and verifying results of the successive programming.

21 Claims, 8 Drawing Sheets

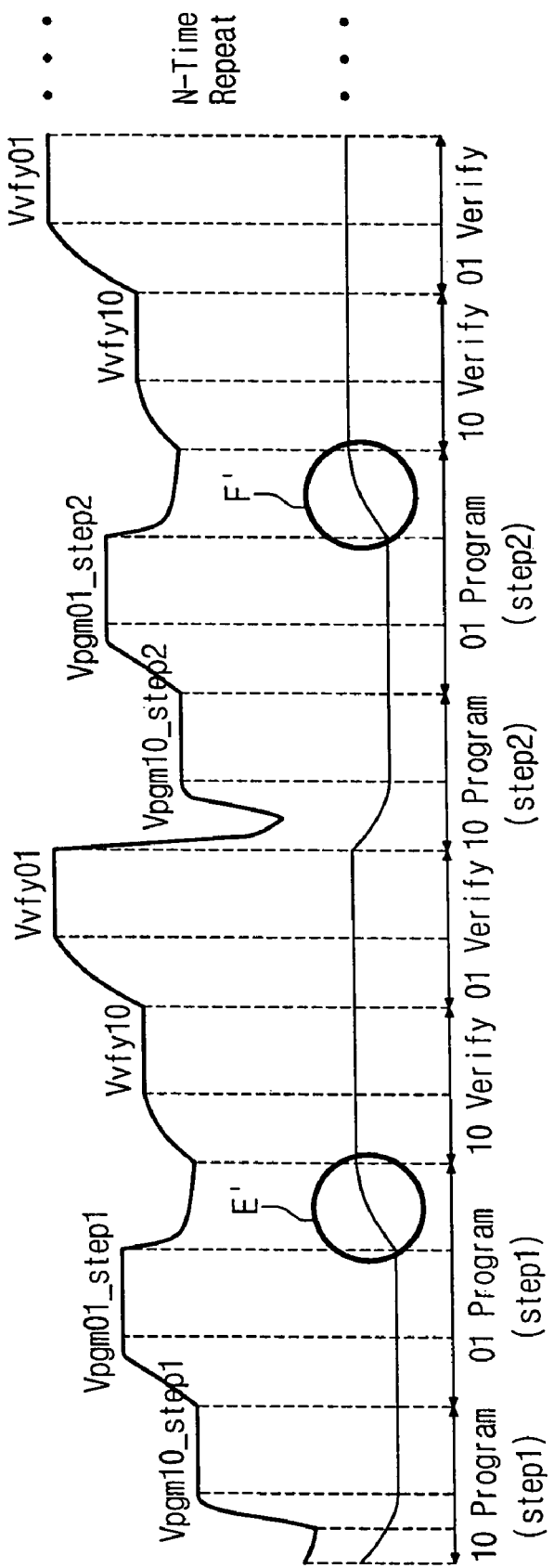

FLASH MEMORY DEVICE AND METHOD FOR PROGRAMMING MULTI-LEVEL CELLS IN THE SAME

BACKGROUND

The present invention relates generally to semiconductor memory devices and, more particularly, the present invention relates to nonvolatile flash semiconductor memory devices.

A claim of priority under 35 U.S.C. § 119 is made to Korean Patent Application No. 2006-82982, filed Aug. 30, 2006, the entire contents of which are hereby incorporated by reference.

Semiconductor memories are widely used in electronic components such as, for example, digital logic circuits and microprocessors. These and other such components may be used in a wide variety of applications ranging from satellite communications to consumer electronics. As demands such as reduction in size and increased operating speed in these applications increase, there is a corresponding demand for features such as high integration density and high frequency of operation from semiconductor devices. There is therefore a need to improve the technologies used in manufacturing semiconductor memories to fulfill such demands.

The semiconductor memory devices are generally classified into volatile memory devices and nonvolatile memory devices. In volatile semiconductor memory devices, information is stored on a temporary basis. This may be done in a number of ways. For example, in a volatile memory device, logical information may be stored by setting a logic condition of a bistable flipflop loop as in a static random access memory (SRAM) or by a capacitive charging effect as in a dynamic random access memory (DRAM.) Furthermore, the volatile semiconductor memory stores and reads data when powered on, but looses the stored data when power is cut off.

On the other hand, the nonvolatile semiconductor memory, such as, for example, MROM, PROM, EPROM, and EEPROM, are able to retain their data even when power supply is cut off. Furthermore, a storage condition in the nonvolatile memory may be designed to be either immutable or re-programmable in accordance with the fabrication techniques used to manufacture the semiconductor memory. Because of their ability, among other things, to retain data in the absence of power, nonvolatile semiconductor memory devices are used in a wide variety of applications. For example, nonvolatile memory devices are used for storing program files and micro-codes in applications such as, for example, computers, aerospace engineering, electronic engineering, communications, and customer electronics.

Among the nonvolatile semiconductor memories, MROM, PROM, and EPROM have features that may make it inconvenient for general users to reprogram these devices. The difficulty in reprogramming these devices lies in the design features of these devices which make it difficult to erase and write date to these devices. On the other hand, an EEPROM can be electrically erased and programmed with data. The ability to electrically erase and program an EEPROM memory makes the EEPROM memory widely popular with general users of electronic devices. Furthermore, flash EEPROMs (hereinafter, referred to as 'flash memory devices') can be fabricated with high integration density without compromising their ability to store large amounts of data. This feature makes flash EEPROMs popular as large-capacity auxiliary storage units.

Flash memories are usually divided into NOR type and NAND type flash memories. This distinction is based on the connection pattern between cells and bit lines. Specifically, the NOR flash memory is configured such that one bit line is coupled to two or more cell transistors in parallel. Furthermore, in the NOR flash memory, data is stored by channel hot electron injection and erased by Folwer-Nordheim (F-N) tunneling effect. In contrast, the NAND flash memory is configured such that one bit line is coupled to two or more cell transistors in series. In addition, in the NAND flash memory, data is stored and erased by means of the F-N tunneling effect.

In general, the large power consumption by a NOR flash memory may makes it unsuitable for high density operation. However, NOR flash memory is suitable for high frequency operation. In addition, in response to recent demands for more integrated NOR flash memories, NOR flash memories employing a multi-level cell (MLC) scheme capable of storing multiple data bits in a single memory cell are increasingly being manufactured by flash manufacturers.

FIG. 1 illustrates distribution profiles of threshold voltages for different data stored in flash memory cells using a MLC scheme. Specifically, FIG. 1 shows the distribution profiles of threshold voltages of MLCs, each storing 2 bits, and data values corresponding to the threshold voltages.

For example, in the case where a single data bit is stored in a unit cell of the flash memory, the data of the unit cell may be represented with two distribution profiles of threshold voltages. In particular, one threshold voltage distribution profile corresponds to data '0' and the other threshold voltage distribution profile corresponds to data '1'.

On the other hand, in the case where multiple data bits are stored in a unit cell of the flash memory, data stored in the unit cell may be represented by four distribution profiles of threshold voltages. These four distribution profiles correspond to data '11', data '10', data '01, and data '00'. Moreover, the data values stored in the unit cell are arranged in the order of '11', '10', '01', and '00'. That is, the stored data values are arranged in an ascending order along the threshold voltages. In particular, data '11' corresponds to an erased state from where a programming operation begins. An MLC flash memory device storing multi-bit data in a single memory cell is disclosed in U.S. Pat. No. 6,101,125 entitled 'ELECTRICAL PROGRAMMING MEMORY AND METHOD OF PROGRAMMING'.

FIG. 2 is a flow chart showing a conventional MLC programming method operable in a NOR flash memory device, which is disclosed in detail in U.S. Pat. No. 6,101,125.

Referring to FIG. 2, the MLC programming operation of the NOR flash memory device begins from the erased state '11'. The procedure of MLC programming is carried out in the sequence of programming data '10' (S100), program-verifying data '10' (S110), programming data '01' (S120), program-verifying data '01' (S130), programming data '00' (S140), and program-verifying data '00' (S150), in this order. Moreover, the distribution profiles of the threshold voltages must be controlled accurately so as to confine the voltage distributions for each data state in well-defined windows.

In order to control the distribution profile of the threshold voltages, a programming scheme such as an incremental step pulse programming (ISPP) scheme may be used to program data onto the flash memory device. According to the ISPP scheme, a threshold voltage increases by an incremental portion of a program loop or voltage. Therefore, the distribution profiles of threshold voltages can be accurately regulated by setting the incremental portion of the program voltage to be smaller. This may make it possible to ensure sufficient margins between voltage distributions of the data states.

FIGS. 3 and 4 are waveform diagrams showing variations of word line voltages Vpgm and Vvfy and a bulk voltage $V_{BULK}$ that are applied to a flash memory cell during the conventional MLC programming operation.

From FIGS. 2 through 4, it can be seen that the conventional multi-bit programming operation is carried out by alternating programming and program-verifying steps with a stepped-up program voltage. For example, as shown in FIG. 3, after a first program voltage Vpgm10_step1 is applied to conduct a first programming step, a program-verifying step begins with a verifying voltage Vvfy10. Thereafter, a second program voltage Vpgm10_step2 is applied to conduct a second programming step and then another program-verifying step begins with the verifying voltage Vvfy10. As seen in FIGS. 3 and 4, the verifying voltage Vvfy10 is higher than the program voltages Vpgm10_step1 and Vpgm10_step2.

Generally, in the conventional multi-bit programming mode where the program voltages (e.g., Vpgm10_step1, Vpgm10_step2, and so on) alternate with the verifying voltage (e.g., Vvfy10), there is a need to have recovery and setup periods. These recovery and set up periods are needed to rapidly change voltage levels when moving from a programming step to a program verifying step and vice versa. As the number of programming steps increase, there is a corresponding increase in the number of recovery and set up periods. In addition, with an increase in the number of recovery and set up periods, there is also an increase in a programming time for the memory cell. Furthermore, there may also be inadvertent overshooting of the program and/or program-verify voltages.

There is therefore a need to develop a programming method and system for programming a flash memory cell with a reduced programming time and a reduced overshooting of programming and/or program verifying voltages.

The present disclosure is directed towards overcoming one or more limitations associated with the conventional programming method of a flash memory cell.

SUMMARY OF THE INVENTION

According to an aspect of the present disclosure, a method for programming a flash memory device is provided, where the flash memory device includes a plurality of memory cells, and where a threshold voltage of each of the memory cells is programmable in any one of plural corresponding data states. The method includes programming selected memory cells in a first data state, verifying a result of the programming, successively programming selected memory cells in at least two or more data states corresponding to threshold voltages which are lower than a corresponding threshold voltage of the first data state, and verifying results of the successive programming.

According to another aspect of the present disclosure, A method for programming a flash memory device is provided, where the flash memory device includes a plurality of memory cells, and where a threshold voltage of each of the memory cells is programmable in any one of plural corresponding data states. The method includes programming selected memory cells in a first data state, verifying a result of the programming in the first data state, programming selected memory cells in a second data state, programming selected memory cells in a third data state, verifying a result of the programming in the second data state, and verifying a result of the programming in the third data state. A corresponding threshold voltage of the third data state is higher than a corresponding threshold voltage of the second data state, and a corresponding threshold voltage of the first data state is higher than the corresponding threshold voltage of the third data state.

According to yet another aspect of the present disclosure, a flash memory device is provided which includes a memory cell array including a plurality of memory cells, wherein a threshold voltage of each of the memory cells is programmable in any one of plural corresponding data states. The flash memory device further includes a controller configured to regulate programming and program-verifying operations of the memory cells, a voltage generator configured to generate a plurality of word line voltages to be used for the programming and program-verifying operations in response to regulation by the controller, a write driver configured to program the memory cells in response to regulation by the controller, and a pass/fail check circuit configured to check programmed data in response to regulation by the controller. The controller regulates the programming and program-verifying operations to program selected memory cells into a first data state, to successively program remaining selected memory cells in at least two or more data states corresponding to threshold voltages which are lower than a corresponding threshold voltage of the first data state, and to verify results of the successive programming.

BRIEF DESCRIPTION OF THE FIGURES

Non-limiting and non-exhaustive exemplary embodiments of the present invention will be described with reference to the following figures, wherein like reference numerals refer to like parts throughout the various figures unless otherwise specified. In the figures:

FIGS. 7 and 8 are waveform diagrams showing variations of word line voltages Vpgm and Vvfy and a bulk voltage $V_{BULK}$ that are applied to a NOR flash memory cell during the MLC programming operation shown in FIG. 6.

DETAILED DESCRIPTION OF PREFERRED EMBODIMENTS

Figure 1:
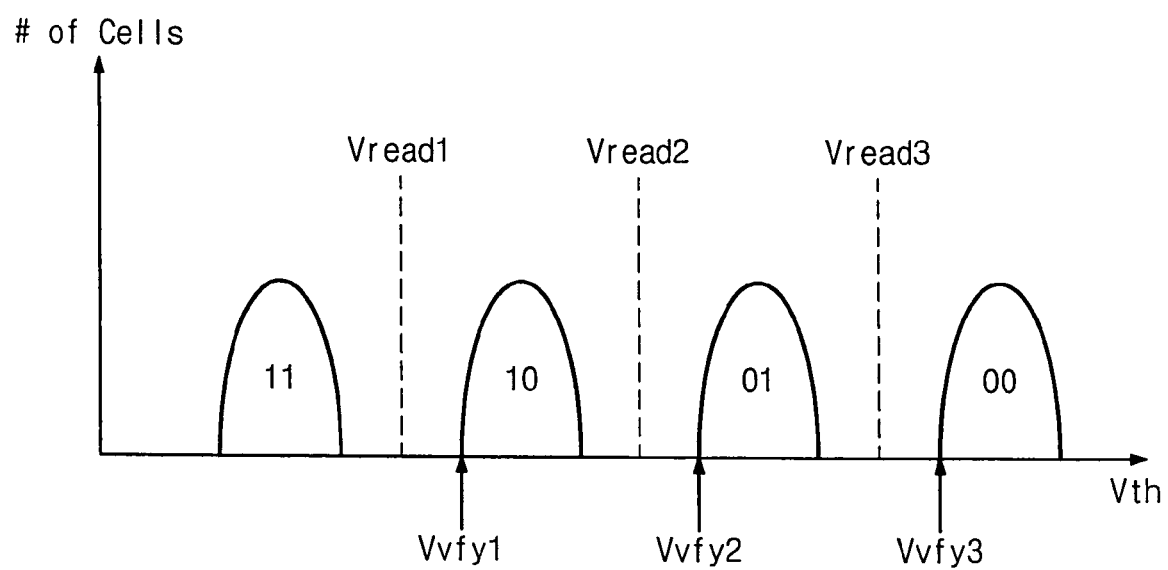
FIG. 1 is a graph diagram showing distribution profiles of threshold voltages and data stored in flash memory cells using the MLC scheme.
Figure 2:
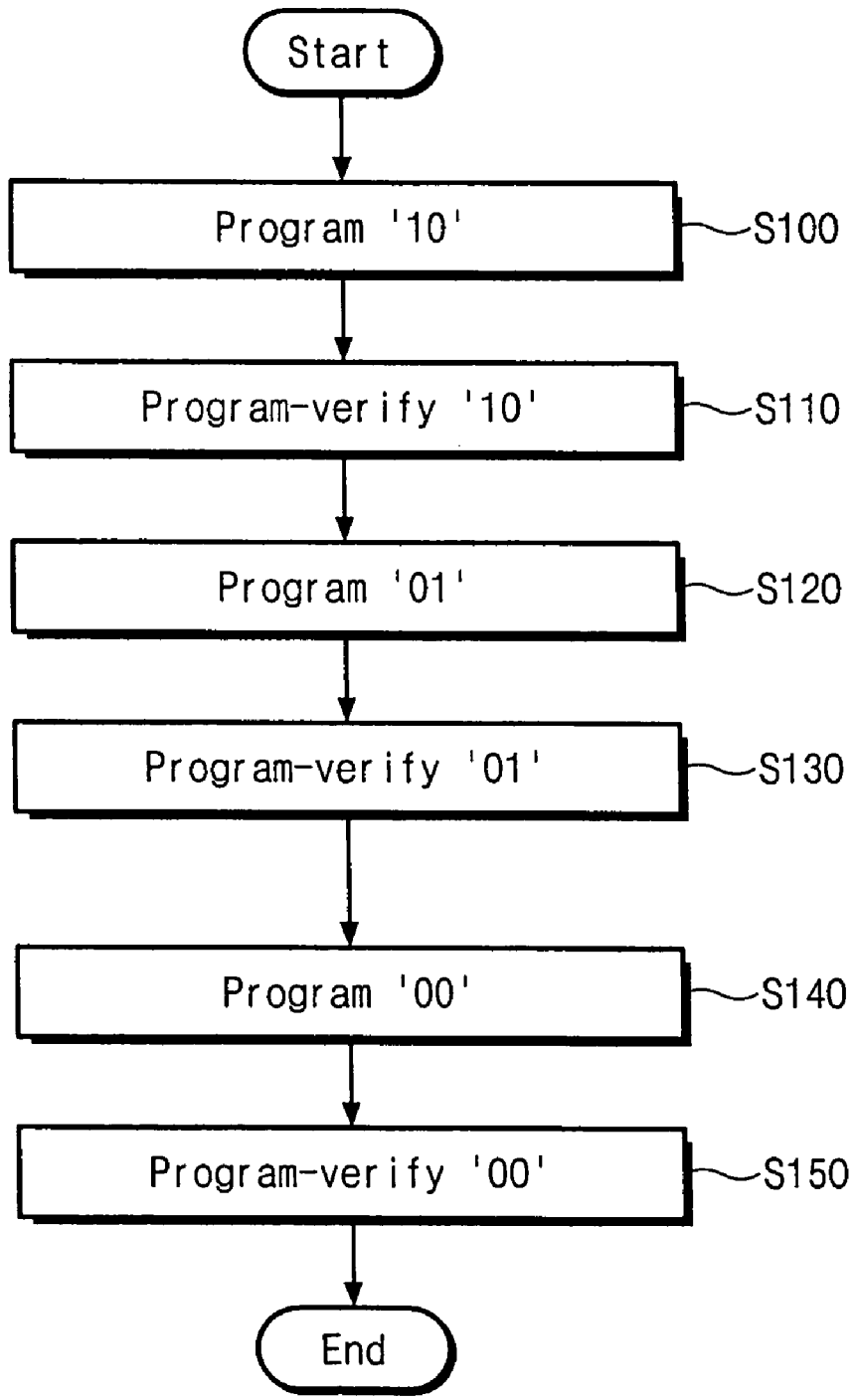
FIG. 2 is a flow chart showing a conventional MLC programming method used to program a NOR flash memory device.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

In general, a flash memory device is programmed by first programming selected memory cells into a first data state. This first data state has the highest threshold voltage amongst all the possible data states. Then, other selected memory cells are continuously programmed into one of at least two or more data states whose threshold voltages are lower than that of the first data state. In addition, the results of this sequential programming are continuously verified during the programming process. By using such a programming scheme it may be possible to reduce the frequency of recovery and setup operations for word line voltages and a bulk voltage. This reduction in the number of recovery and setup operations may shorten an overall programming time of the flash memory device. Additionally, it may lessen a difference between the word line voltages successively generated and hence prevent overshoots of voltages.

Figure 5:
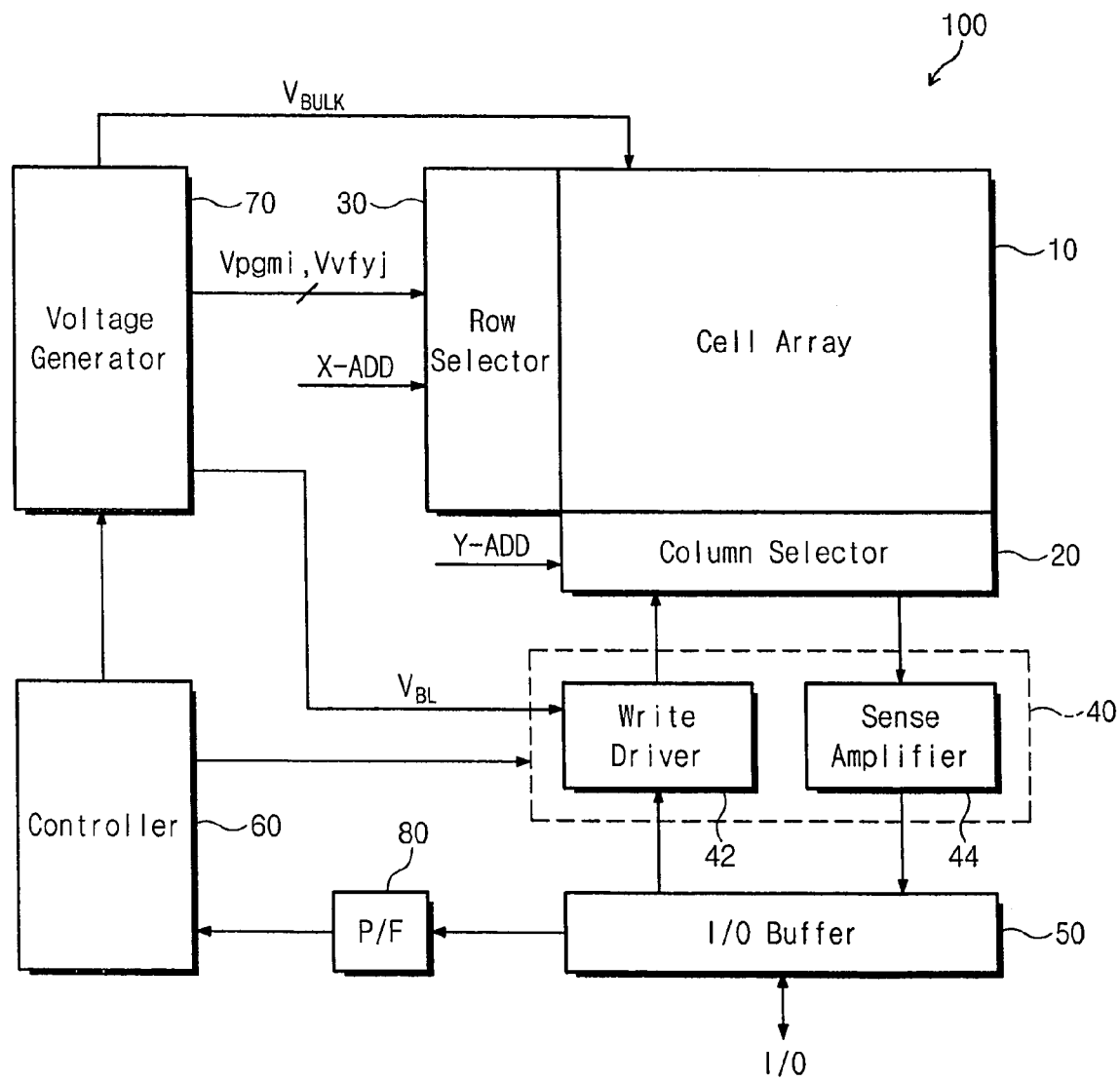
FIG. 5 is a block diagram illustrating an overall structure of a flash memory device in accordance with an exemplary disclosed embodiment.

FIG. 5 is a block diagram illustrating an overall structure of a flash memory device 100 according to an exemplary disclosed embodiment. Specifically, the flash memory device 100 shown in FIG. 5 is exemplarily illustrated as a NOR type device operable in an MLC data storage scheme.

Referring to FIG. 5, the flash memory device 100 is comprised of a memory cell array 10, a column selector 20, a row selector 30, a data input/output (I/O) circuit 40, an input/output (I/O). buffer 50, a controller 60, a voltage generator 70, and a pass/fail check circuit (P/F) 80.

The memory cell array 10 includes a plurality of memory cells. These memory cells are arranged at intersections of plural rows (i.e., word lines) and columns (i.e., bit lines). Furthermore, each memory cell is an MLC that is programmable in one of the plural data state values ('11', '10', '01', and '00') shown in FIG. 1.

The voltage generator 70 provides a variety of static voltages such as, for example, a program voltage Vpgmi, a verifying voltage Vvfyi, a bit line voltage $V_{BL}$, and a bulk voltage $V_{BULK}$, that are required for programming, erasing, and reading the memory cells. The row selector 30 operates to select one of the static voltages from the voltage generator 70 in response to a row address X-ADD, and applies the selected voltage to a word line corresponding thereto. The column selector 20 operates to select a bit line connected to a memory cell to be programmed or read from among memory cells belonging to a selected word line, in response to a column address Y-ADD.

The I/Q buffer 50 stores data to be programmed in the memory cell array 10 or data sensed from the memory cell array 10. To this end, the data I/O circuit 40 is composed of a write driver 42 and a sense amplifier 44. The write driver 42 functions to program a selected memory cell with program data received from the I/0 buffer 50. The sense amplifier 44 detects data programmed in a selected memory cell. Data detected by the sense amplifier 44 is stored in the I/O buffer 50. The sensed data stored in the I/O buffer 50 is verified for its programmed result by means of the pass/fail check circuit 80. A result of program verification by the pass/fail check circuit 80 is provided to the controller 60. The controller 60 regulates the programming operation in response to the program verification result provided from the pass/fail check circuit 80. The programming operation in an exemplary embodiment is an MLC programming operation for writing multi-bit data in a unit flash memory cell. In addition, besides regulating the programming operation, the controller 60 also regulates overall functions relevant to the operations of erasing and reading the flash memory device.

As described hereinafter, the controller 60 conducts a new MLC programming mode. In the new programming mode, the sequence of the programming and program-verifying steps is different from that in the conventional MLC programming mode. Specifically, the controller 60 controls the programming in such a manner that the program verifying steps are conducted in succession after performing two programming steps instead of one. In order to perform this programming method, the controller 60 operates to control generation of the program voltage Vpgmi, the verifying voltage Vvfyi, the bit line voltage $V_{BL}$, and the bulk voltage $V_{BULK}$, corresponding to the sequential steps of the programming operation. Furthermore, the number of the successive programming and program-verifying steps may be varied in accordance with the number (or kinds) of data state values programmable in the memory cell.

The above-mentioned programming scheme has several features. One feature includes the possibility of reducing recovery and setup time for the program voltage Vpgmi, the verifying voltage Vvfyi, and the bulk voltage $V_{BULK}$, to about half of these times in conventional programming schemes. Furthermore, the disclosed programming scheme may also reduce gaps between the voltages by a larger amount as compared to that in conventional programming schemes.

Figure 6:
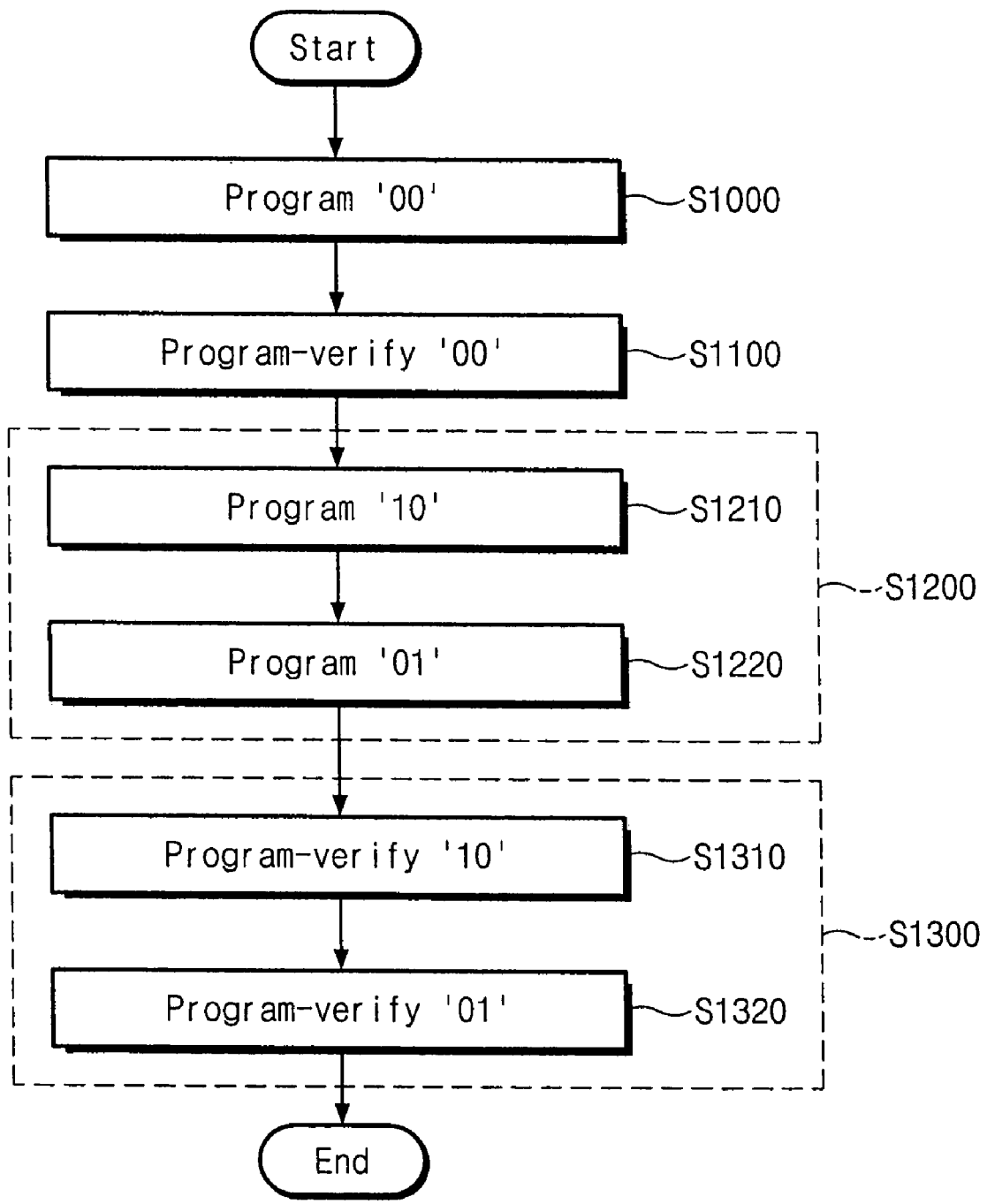
FIG. 6 is a flow chart showing an MLC programming method in accordance with an exemplary disclosed embodiment.

FIG. 6 is a flow chart illustrating an MLC programming method according to an exemplary disclosed embodiment. The disclosed steps program data by applying voltages falling within voltage distribution profiles corresponding to different data states. In an exemplary 2-bit MLC, these data states are '11', '10', '01', and '00'. Furthermore, the state '11' is a state in which the memory cell is erased. In this erased condition, the threshold voltage of the cell is at the lowest level. A memory cell programmed in the state '10' has a threshold voltage that is higher than that of a memory cell in state '11'. In addition, a memory cell programmed in the state '01' has a threshold voltage that is higher than that of a memory cell in state '10'. Moreover, a memory cell programmed in the state '00' has a threshold voltage that is higher than that of a memory cell in state '01'. However, such a distribution pattern of threshold voltages is exemplary only. That is, these distribution patterns may be modified in accordance with a programming mode.

At step S1000, data '00' is first programmed using a sufficiently high program voltage. At step S1100 the data programmed (i.e., '00') is verified using a program-verify voltage. As mentioned above, the threshold voltage distribution of data state '00' is the highest amongst the four data states. Then, at step S1200, the memory cell is sequentially programmed with two sets of data, '10' and '01'. Specifically, data '10' is programmed at step S1210 and data '01' is programmed at step S1220. At step S1300, the programmed data '10' and '01' are verified in sequence using corresponding program-verify voltages. Specifically, at step S1310, a program verification process is carried out to verify the programming of data '10' and at step S1320 another program verification process is carried out to verify the programming of data '01'.

As illustrated in FIG. 1, the threshold voltage distribution profiles of the data states '01' and '01' are adjacent to each other. Therefore, in order to confine the threshold voltages of the states '10' and '01' within their predetermined distribution windows, their programming operations should be beneficially controlled with greater precision than the programming operation for the data state '00'. Thus, as aforementioned, in an exemplary embodiment, the programming operation to program data '0' is separated from the programming operations that program data '10' and '01'. This separation may ensure that the programming of data '10' and '01' is controlled more precisely than that of data '00'. Furthermore, as indicated in the flow chart of FIG. 6, the steps of programming and program-verifying the data group of '10' and '01' are carried out after completing the programming step for data '00'.

Figure 7:
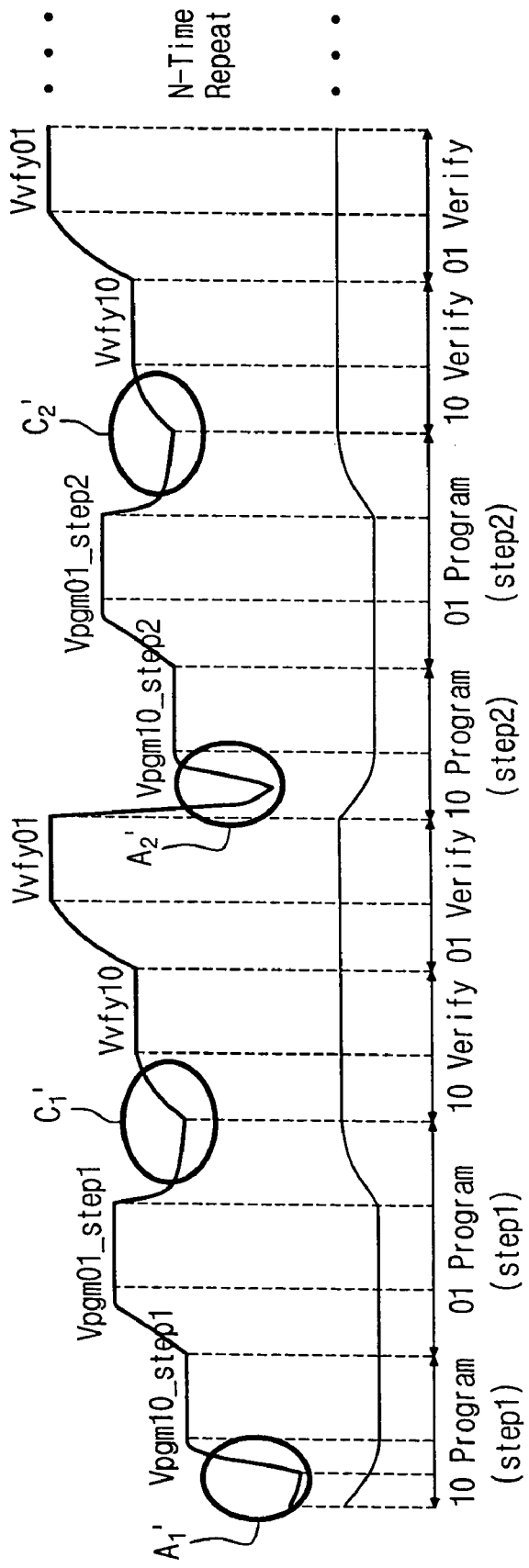

FIGS. 7 and 8 are waveform diagrams showing variations of the word line voltages Vpgm and Vvfy and the bulk voltage $V_{BULK}$ that are applied thereto during the MLC programming operation shown in FIG. 6. Referring to FIGS. 6 through 8, in an exemplary disclosed embodiment, two programming steps are carried out with stepped-up program voltages. Furthermore, after the two programming steps, the program-verifying steps are carried out in succession to check results of the programming steps. For example, after conducting a first programming step with a first program voltage Vpgm10_step1, a second programming step is subsequently carried out with a second program voltage Vpgm01_step1. In addition, after the two programming steps, a first program-verifying step is carried out with a first verifying voltage Vvfy10 and a second program-verifying step is carried out with a second verifying voltage Vvfy01. Here, the verifying voltages Vvfy10 and Vvfy01 are higher than their corresponding program voltages Vpgm10_step1 and Vpgm01_step1 respectively. Moreover, the second verifying voltage Vvfy01 is higher than the first verifying voltage Vvfy10, and the second program voltage Vpgm01_step1 is higher than the first program voltage Vpgm10_step1. One observable difference between FIGS. 3 and 7 is that the program voltages Vpgm10_step1 and Vpgm01_step1 in FIG. 7 are included in the same step of the ISPP scheme shown in FIG. 3.

Figure 3:
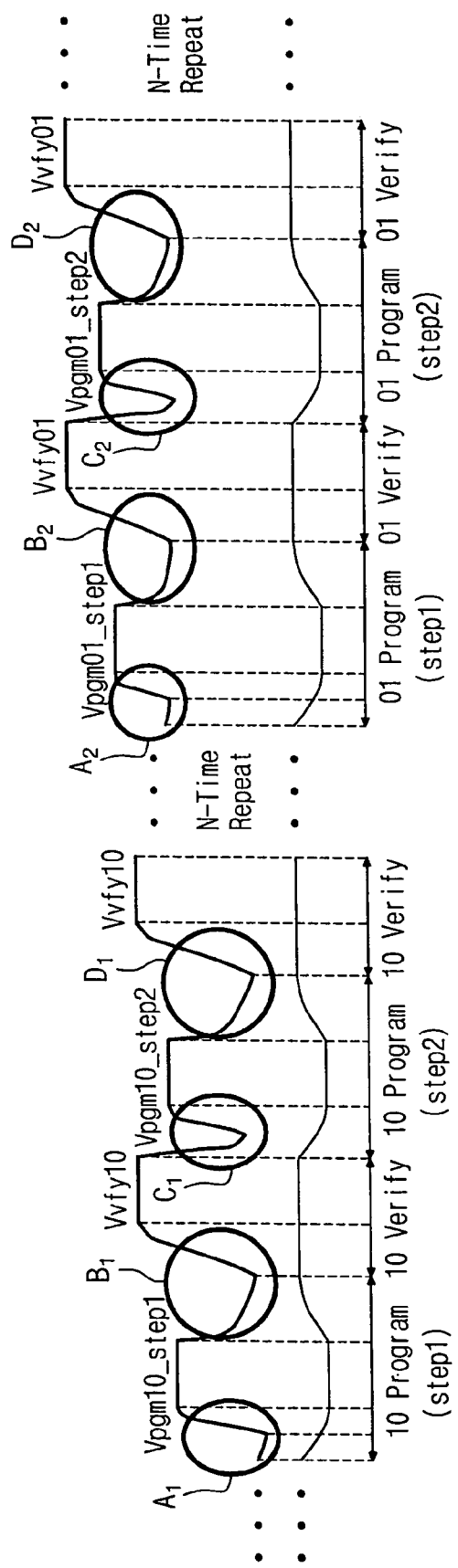
FIGS. 3 and 4 are waveform diagrams showing variations of word line voltages Vpgm and Vvfy and a bulk voltage $V_{BULK}$ that are applied to a NOR flash memory cell during the conventional MLC programming operation.

As illustrated in FIG. 3, the conventional MLC programming mode is carried out by alternately generating the program voltages Vpgm10_step1 and Vpgm10_step2 and the plural verifying voltages Vvfy10. Therefore, there is a recovery and setup period (A1, B1, C1, D1, A2, B2, C2, and D2) for each instance of voltage generation. Because of the large number of recovery and setup periods, the programming time may be long. Furthermore, the voltages shown in FIG. 3 are irregular and different from each other in level. This irregularity and difference between the voltages may cause overshooting during the setup period. In addition, such problems in a conventional programming method may be exacerbated when the flash memory device is equipped with a pump circuit for generating the program and verifying voltages.

In contrast, in an exemplary disclosed embodiment in FIG. 7, the MLC programming is carried out by generating the program voltage Vpgm continuously for two steps followed by two continuous generations of a program-verifying voltage. As a result, the recovery and setup periods (A1', C1', A2', and C2'), are reduced to half of that in the conventional case. Furthermore, during such voltage generation, the voltages are leveled in small voltage gaps and regularized in incremental portions. This reduction in the difference between voltage levels may reduce overshoots in the voltage setup periods.

Figure 4:
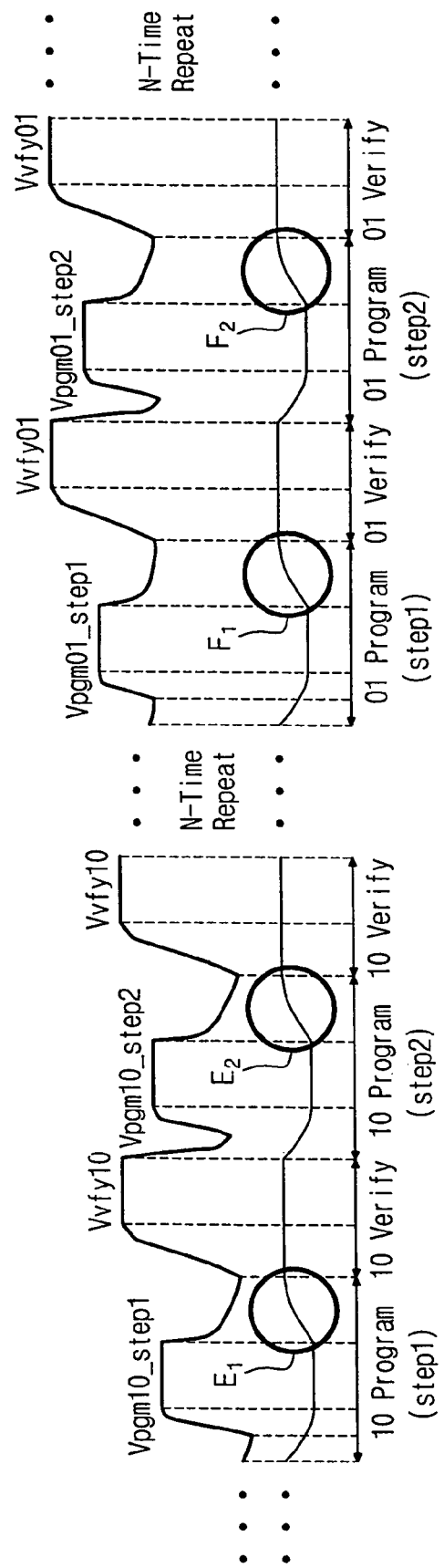

FIGS. 4 and 8 display the difference between the bulk voltage $V_{BULK}$ in a conventional programming method and the bulk voltage $V_{BULK}$ in an exemplary disclosed embodiment. Specifically, in the conventional MLC programming scheme shown in FIG. 4, a negative bulk voltage $V_{BULK}$ is activated with the generation of each of the program voltages Vpgm10_step1, Vpgm10_step2, and so on. In addition, the negative bulk voltage $V_{BULK}$ recovers to an initial value with the generation of each of the verifying voltages Vvfy10 and Vvfy01. That is, in the conventional MLC programming scheme, because the program voltages Vpgm10_step1, Vpgm10_step2, and so on, alternate with the verifying voltages Vvfy10 and Vvfy01, the recovery of the bulk voltage $V_{BULK}$ occurs frequently in time (see E1, E2, F1, and F2 in FIG. 4).

In contrast, in the exemplary disclosed MLC programming scheme in FIG. 8, the recovery times of the bulk voltage $V_{BULK}$ is reduced to half of that in the conventional case (see E' F' in FIG. 8). Such smaller recovery times of the bulk voltage are possible because the program and verifying voltages are continuously generated twice with sequentially stepped-up patterns and the bulk voltage $V_{BULK}$ set up once can be used for at least two programming steps. Thus, the recovery and setup periods for the bulk voltage $V_{BULK}$ are shortened to half of that in the conventional case. This reduction in the recovery and setup periods for the bulk voltage $V_{BULK}$ may reduce the overall programming time of the flash memory device.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for programming a flash memory device comprising a plurality of memory cells, wherein a threshold voltage of each of the memory cells is programmable in any one of a plurality of data states, said method comprising:
   programming selected memory cells in a first data state, the first data state having a corresponding first threshold voltage;
   verifying a result of the programming;
   successively programming selected memory cells in at least two data states corresponding to threshold voltages which are lower than the first threshold voltage; and
   verifying results of the successive programming.

2. The method as set forth in claim 1, wherein the successive programming comprises first programming selected memory cells into a data state having a corresponding threshold voltage that is lowest among the corresponding threshold voltages of the at least two data states.

3. The method as set forth in claim 1, wherein verifying the results of successive programming comprises successively verifying program data corresponding to the at least two data states after the successive programming of the at least two data states.

4. The method as set forth in claim 3, wherein the successive verifying comprises successively applying at least two program-verify voltages corresponding to the at least two data states.

5. The method as set forth in claim 1, wherein the first data state has a highest corresponding threshold voltage among the programmable data states of the flash memory device.

6. The method as set forth in claim 1, wherein each programming is implemented in accordance with an incremental step pulse programming scheme.

7. A method for programming a flash memory device comprising a plurality of memory cells, wherein a threshold voltage of each of the memory cells is programmable in any one of a plurality of corresponding data states, said method comprising:
   programming selected memory cells in a first data state;
   verifying a result of the programming in the first data state;
   programming selected memory cells in a second data state;
   programming selected memory cells in a third data state;
   verifying a result of the programming in the second data state; and
   verifying a result of the programming in the third data state, wherein a corresponding threshold voltage of the third data state is higher than a corresponding threshold voltage of the second data state, and a corresponding threshold voltage of the first data state is higher than the corresponding threshold voltage of the third data state.

8. The method as set forth in claim 7, wherein the first data state denotes a multi-bit logic value of '00', the second data state denotes a multi-bit logic value of '10', and the third data state denotes a multi-bit logic value of '01'.

9. The method as set forth in claim 7, wherein each programming comprises incremental step pulse programming.

10. A flash memory device comprising:
a memory cell array including a plurality of memory cells, wherein a threshold voltage of each of the memory cells is programmable in any one of a plurality of corresponding data states;
a controller configured to regulate programming and program-verifying operations of the memory cells;
a voltage generator configured to generate a plurality of word line voltages for the programming and program-verifying operations in response to regulation by the controller;
a write driver configured to program the memory cells in response to regulation by the controller; and
a pass/fail check circuit configured to check programmed data in response to regulation by the controller,
wherein the controller regulates the programming and program-verifying operations to program selected memory cells into a first data state, to successively program remaining selected memory cells in at least two data states corresponding to threshold voltages which are lower than a corresponding threshold voltage of the first data state, and to verify results of the successive programming.

11. The flash memory device as set forth in claim 10, wherein the write driver, during the successive programming, first programs the remaining selected memory cells into a data state that has a corresponding threshold voltage that is lowest among the corresponding threshold voltages of the at least two data states in response to regulation by the controller.

12. The flash memory device as set forth in claim 10, wherein the pass/fail check circuit verifies the results of the successive programming by successively verifying a program data corresponding to the at least two data states after the successive programming of the at least two data states, in response to regulation by the controller.

13. The flash memory device as set forth in claim 12, wherein the pass/fail check circuit first verifies a data state having a lowest corresponding threshold voltage among the at least two data states.

14. The flash memory device as set forth in claim 10, wherein the first data state has a highest corresponding threshold voltage among the programmable data states of the flash memory device.

15. The flash memory device as set forth in claim 10, wherein each programming operation is implemented in accordance with an incremental step pulse programming scheme.

16. The flash memory device as set forth in claim 10, wherein the voltage generator is further configured to conduct a recovery operation for a word line voltage generated after the successive programming.

17. The flash memory device as set forth in claim 10, wherein the voltage generator is further configured to generate stepped-up program voltages for the successive programming.

18. The flash memory device as set forth in claim 10, wherein the voltage generator is further configured to conduct a recovery operation for a word line voltage generated after the successive program-verifying.

19. The flash memory device as set forth in claim 10, wherein the voltage generator is further configured to generate stepped-up verifying voltages for the successive programming.

20. The flash memory device as set forth in claim 10, wherein the voltage generator is further configured to generate a negative bulk voltage to be used for the programming operation.

21. The flash memory device as set forth in claim 20, wherein the voltage generator is further configured to conduct a recovery operation for the bulk voltage generated after the successive programming.

* * * * *